US012595563B2

(12) United States Patent
Hirose et al.

(10) Patent No.: US 12,595,563 B2
(45) Date of Patent: Apr. 7, 2026

(54) SUBSTRATE PROCESSING METHOD

(71) Applicant: Tokyo Electron Limited, Tokyo (JP)

(72) Inventors: Hiroshi Hirose, Nirasaki (JP); Masaomi Kobe, Nirasaki (JP); Koichi Miyashita, Nirasaki (JP); Takafumi Nogami, Nirasaki (JP); Kenichi Kote, Nirasaki (JP); Kouji Iihoshi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 692 days.

(21) Appl. No.: 17/912,201

(22) PCT Filed: Mar. 12, 2021

(86) PCT No.: PCT/JP2021/010110
§ 371 (c)(1),
(2) Date: Sep. 16, 2022

(87) PCT Pub. No.: WO2021/193149
PCT Pub. Date: Sep. 30, 2021

(65) Prior Publication Data
US 2023/0135618 A1     May 4, 2023

(30) Foreign Application Priority Data

Mar. 25, 2020   (JP) ................................. 2020-054588

(51) Int. Cl.
*C23C 16/52*      (2006.01)
*C23C 16/44*      (2006.01)
(Continued)

(52) U.S. Cl.
CPC .......... *C23C 16/52* (2013.01); *C23C 16/4405* (2013.01); *C23C 16/511* (2013.01);
(Continued)

(58) Field of Classification Search
CPC .... C23C 16/52; C23C 16/4405; C23C 16/511
See application file for complete search history.

(56) References Cited

U.S. PATENT DOCUMENTS 6,716,649 B2 *   4/2004   Ziger .................... G03F 9/7003
                                                          438/14
8,882,917 B1 *   11/2014   Cheng .................... C23C 14/54
                                                          118/730
(Continued)

FOREIGN PATENT DOCUMENTS

CN        102737945        * 10/2012    ............. H01J 37/32
JP        2001-11641 A       1/2001
(Continued)

OTHER PUBLICATIONS

Goudar, Chetan T., "Accurate kinetic parameter estimation during progress curve analysis of systems with endogenous substrate production". Biotechnology and Bioengineering, vol. 108, No. 10, Oct. 2011, pp. 2499-2503.*
(Continued)

*Primary Examiner* — Bret P Chen
(74) *Attorney, Agent, or Firm* — Nath, Goldberg & Meyer; Jerald L. Meyer; Tanya E. Harkins

(57)              ABSTRACT

A substrate processing method includes: a step of preparing a substrate in a chamber of a substrate processing apparatus; a step of correcting a set power value based on a correction value Y from Equation (1), coefficients A, B, C, and D, and a variable X indicating a processed amount of the substrates having been subjected to continuous film formation processes, referring to a storage in which the coefficients A, B, C, and D of the Equation (1) used to calculate the correction value Y for the set power value are stored; and a step of processing the prepared substrate by applying power with the corrected power value into the chamber, the Equation (1) is expressed as $Y=A \exp(BX)+CX+D$, where at least one of
(Continued)

the coefficients A, C, and D is not zero, and when the coefficient A is not zero, the coefficient B is also not zero.

7 Claims, 7 Drawing Sheets

(51) Int. Cl.
C23C 16/511 (2006.01)
H01J 37/32 (2006.01)

(52) U.S. Cl.
CPC .. H01J 37/32266 (2013.01); H01J 37/32862 (2013.01); H01J 2237/3321 (2013.01)

(56) References Cited

U.S. PATENT DOCUMENTS

| | | | | |
|---|---|---|---|---|
| 2004/0097063 A1* | 5/2004 | Sakuma | .................. | C23C 16/52 |
| | | | | 438/616 |
| 2009/0286566 A1* | 11/2009 | Lindholm | ........... | H04W 52/242 |
| | | | | 455/522 |
| 2011/0281376 A1* | 11/2011 | Amano | ............... | H01L 21/6708 |
| | | | | 156/345.24 |
| 2013/0169359 A1* | 7/2013 | Coumou | ................. | H03F 3/191 |
| | | | | 330/192 |
| 2019/0177849 A1* | 6/2019 | Mo | ......................... | C23C 16/52 |

FOREIGN PATENT DOCUMENTS

| | | | | | |
|---|---|---|---|---|---|
| JP | 2002-299328 A | | 10/2002 | | |
| JP | 2010-098053 A | | 4/2010 | | |
| JP | 2014-11255 | * | 1/2014 | ............. | H01L 21/02 |
| JP | 2019-216150 A | | 12/2019 | | |
| WO | WO 2013/114870 A1 | * | 8/2013 | ......... | H01L 21/3065 |

OTHER PUBLICATIONS

Wang, Kaishi, et al., "A semi-empirical power-law model for the dip-coating of a substrate into a particle-containing, non-Newtonian, complex fluid system". Ceramics International vol. 45, Issue 6, Apr. 15, 2019, pp. 6655-6664.*

* cited by examiner $$Y_{(n-1)} = A_{(n-1)} \exp(B_{(n-1)} \cdot X_{(n-1)}) + C_{(n-1)} \cdot X_{(n+1)} + D_{(n-1)} \rightarrow A \sim D \neq 0$$

$$Y_n = A_n \exp(B_n \cdot X) + C_n \cdot X + D_n \rightarrow A \sim D \neq 0$$

X: Accumulation value of number of substrates

FIG. 3A

| Depo / Process | Coefficients | | | |
|---|---|---|---|---|
| Sections | A | B | C | D |
| 1 | Group a | | | |
| 2 | Group a | | | |
| ⌇ | ⌇ | | | |
| n−1 | Group b | | | |
| n | Group b | | | |
| n+1 | Group b | | | |
| ⋮ | ⋮ | | | |

FIG. 3B

| Groups | Coefficients | | | |
|---|---|---|---|---|
| | A | B | C | D |
| a | $A_1$ | $B_1$ | $C_1$ | $D_1$ |
| b | $A_2$ | $B_2$ | $C_2$ | $D_2$ |

FIG. 5

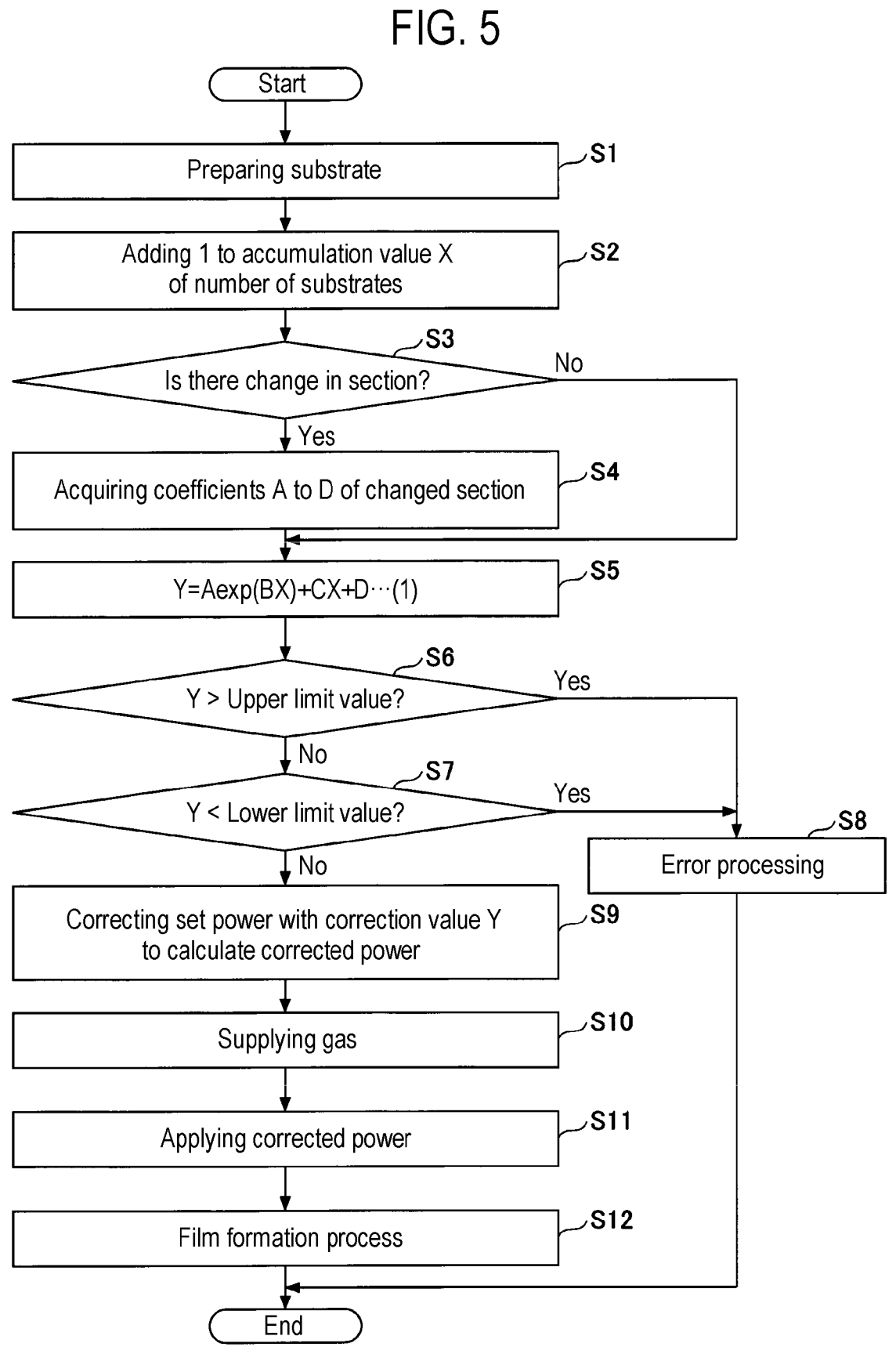

Start

Preparing substrate   S1

Adding 1 to accumulation value X of number of substrates   S2

S3 — Is there change in section?   No

Yes

Acquiring coefficients A to D of changed section   S4

$Y=A\exp(BX)+CX+D\cdots(1)$   S5

S6 — Y > Upper limit value?   Yes

No

S7 — Y < Lower limit value?   Yes

No

Error processing   S8

Correcting set power with correction value Y to calculate corrected power   S9

Supplying gas   S10

Applying corrected power   S11

Film formation process   S12

End

SUBSTRATE PROCESSING METHOD

This is a National Phase Application filed under 35 U.S.C. 371 as a national stage of PCT/JP2021/010110, filed Mar. 12, 2021, an application claiming the benefit of Japanese Patent Application No. 2020-054588, filed Mar. 25, 2020, the content of each of which is hereby incorporated by reference in its entirety.

TECHNICAL FIELD

The present disclosure relates to a substrate processing method and a substrate processing apparatus.

BACKGROUND

There is known a substrate processing apparatus that applies microwaves or radio-frequency power into a chamber to process a substrate by using a gas. In the substrate processing apparatus, deposits accumulate on a wall of the chamber or the like during substrate processing. For this reason, for example, Patent Document 1 proposes applying microwave power to remove deposits deposited on the wall surface of a chamber or the like by plasma of a cleaning gas.

PRIOR ART DOCUMENT

Patent Document

Patent Document 1: Japanese laid-open publication No. 2019-216150

The present disclosure provides a technique capable of suppressing variations in substrate processing.

SUMMARY

According to an aspect of the present disclosure, provided is a substrate processing method including: the step of preparing a substrate in a chamber of a substrate processing apparatus; the step of correcting a set power value based on a correction value Y obtained from Equation (1), coefficients A, B, C, and D, and a variable X indicating a processed amount of the substrates having been subjected to continuous film formation processes, while referring to a storage part in which the coefficients A, B, C, and D of the Equation (1) used to calculate the correction value Y for the set power value are stored; and the step of processing the prepared substrate by applying power with the corrected power value into the chamber, the Equation (1) is expressed as Y=A exp(BX)+CX+D, where at least one of the coefficients A, C, and D is not zero, and when the coefficient A is not zero, the coefficient B is also not zero.

According to an aspect, it is possible to suppress variations in substrate processing.

BRIEF DESCRIPTION OF DRAWINGS

FIG. 3A is a view illustrating an example of coefficients A, B, C, and D stored in a memory according to an embodiment.

FIG. 3B is a view illustrating an example of coefficients A, B, C, and D stored in a memory according to an embodiment.

FIG. 5 is a flowchart illustrating an example of a substrate processing method according to an embodiment.

DETAILED DESCRIPTION

Figures 1A, 1B:
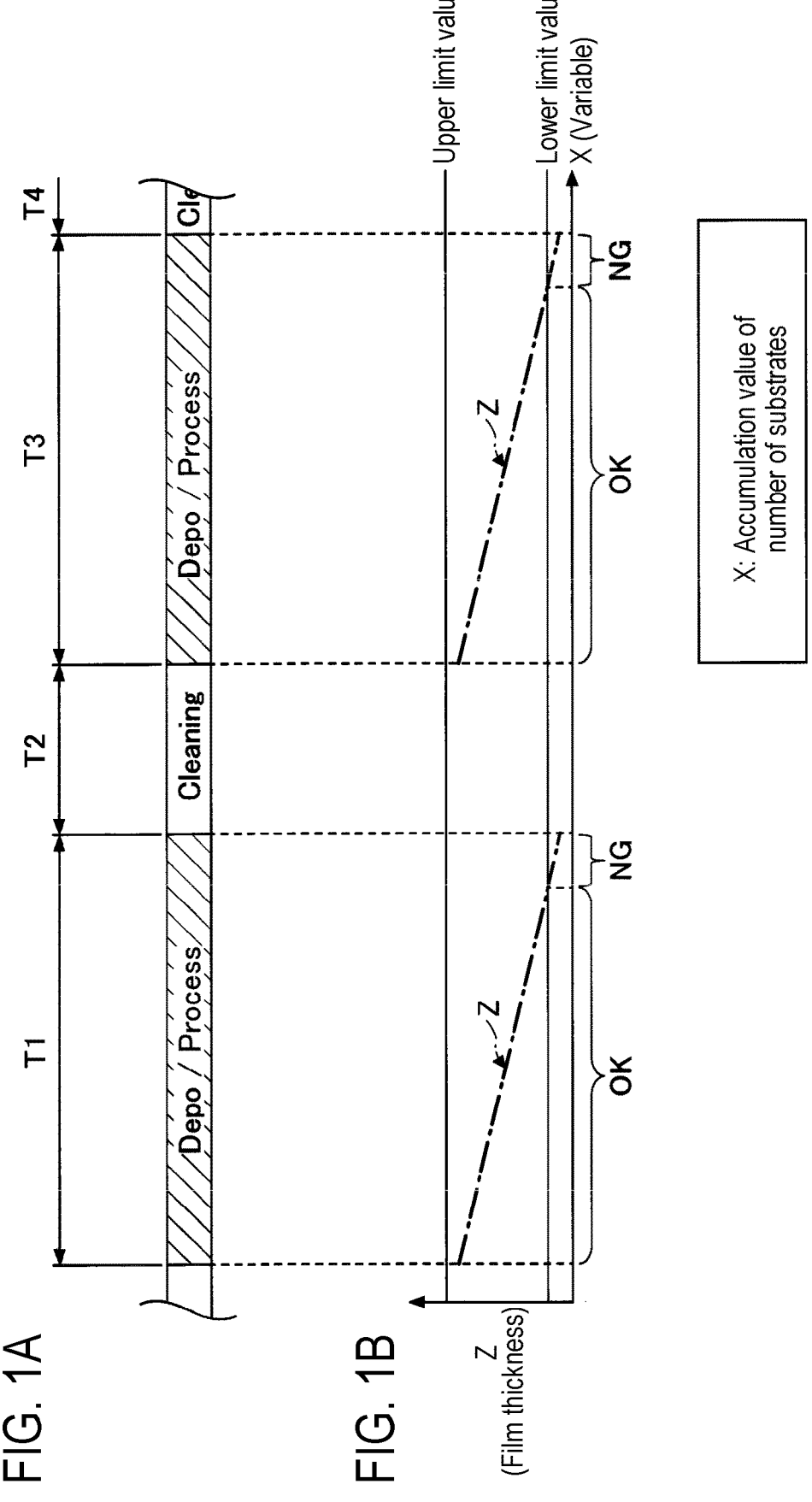
FIGS. 1A and 1B are diagrams for explaining an example of variations in substrate processing.

Hereinafter, embodiments of the present disclosure will be described with reference to the accompanying drawings. In each of the drawings, the same components may be denoted by the same reference numerals, and redundant descriptions thereof may be omitted.
[Variations in Substrate Processing]
Variations in substrate processing will be described with reference to FIGS. 1A and 1B. FIGS. 1A and 1B are diagrams illustrating an example of variations in substrate processing. As an example of substrate processing, an example in which a substrate is subjected to a film formation process in a chamber of a substrate processing apparatus will be described. The configuration of the substrate processing apparatus will be described later with reference to FIGS. 6 and 7 as an example.

In the example of FIG. 1A, steps of substrate film formation processes (deposition processes) are performed in a time T1 and a time T3, and a step of a cleaning process in the chamber is performed in a time T2. In the steps of the film formation processes in the time T1 and the steps of the film formation processes in the time T3, for example, several thousand substrates are subjected to continuous film formation processes according to the same process recipe. In the step of the cleaning process, deposits deposited on the wall surfaces of the chamber or the like during the film formation processes of the substrate are removed. After the step of the cleaning process, the atmosphere in the chamber at the beginning of the substrate film formation process in the time T3 is substantially the same as the atmosphere in the chamber at the beginning of the substrate film formation process in the time T1.

For example, when the substrate film formation processes are continuously performed on several thousand substrates, even if the film formation process is performed according to the same process recipe, the same film formation process is not performed on each substrate, and variations occur in film thickness and film quality (characteristics of films). An example thereof will be described with reference to FIG. 1B. The variable X on the horizontal axis shown in FIG. 1B indicates an accumulation value of the number of processed substrates. For example, when several thousand substrates are subjected to continuous film formation processes in the time T1 and several thousand substrates are subjected to continuous film formation processes in the time T3, the accumulation value of the number of substrates during the process in the time T1 becomes several thousand. After the accumulation value is reset by the cleaning process, the accumulation value of the number of substrates during the process in the time T3 becomes several thousand. The number of substrates to be processed continuously in a substrate film formation process is not limited to this, and may be several hundred or any other number.

The variable Z on the vertical axis shown in FIG. 1B is a film thickness formed on each processed substrate. Since the steps of the film formation process in the time T1 and the steps of the film formation process in the time T3 are executed based on the same process recipe, it is ideal that films having the same film thickness and film quality are formed on each substrate even if the number of processed substrates increases. In practice, however, as shown in FIG. 1B, the film thickness indicated with the variable Z on the vertical axis decreases as the accumulation value of the number of processed substrates indicated with the variable X on the horizontal axis increases. Although not shown, the film quality is also not constant, and as the number of processed substrates increases, the refractive index (RI), which is an example of film quality, increases.

There is a permissible range for variations in film thickness and film quality. In the example of FIG. 1B, as long as the film thickness indicated by the variable Z is between a given upper limit value and a lower limit value, variations in film thickness are allowed, but when the variable Z exceeds the upper limit value or the lower limit value, the product cannot be shipped as a product, resulting in a decreased yield. FIG. 1B shows an example in which the products cannot be shipped when the film thickness is less than the lower limit value. Therefore, it is important to suppress variations in film thickness and film quality of the films of the substrates subjected to the continuous film formation processes. Therefore, in the present embodiment, by correcting a preset power value, i.e., a preset power value of electric power, variations in film thickness and film quality are suppressed to achieve uniformity of the substrates subjected to the continuous film formation processes.

Figures 2A, 2B:
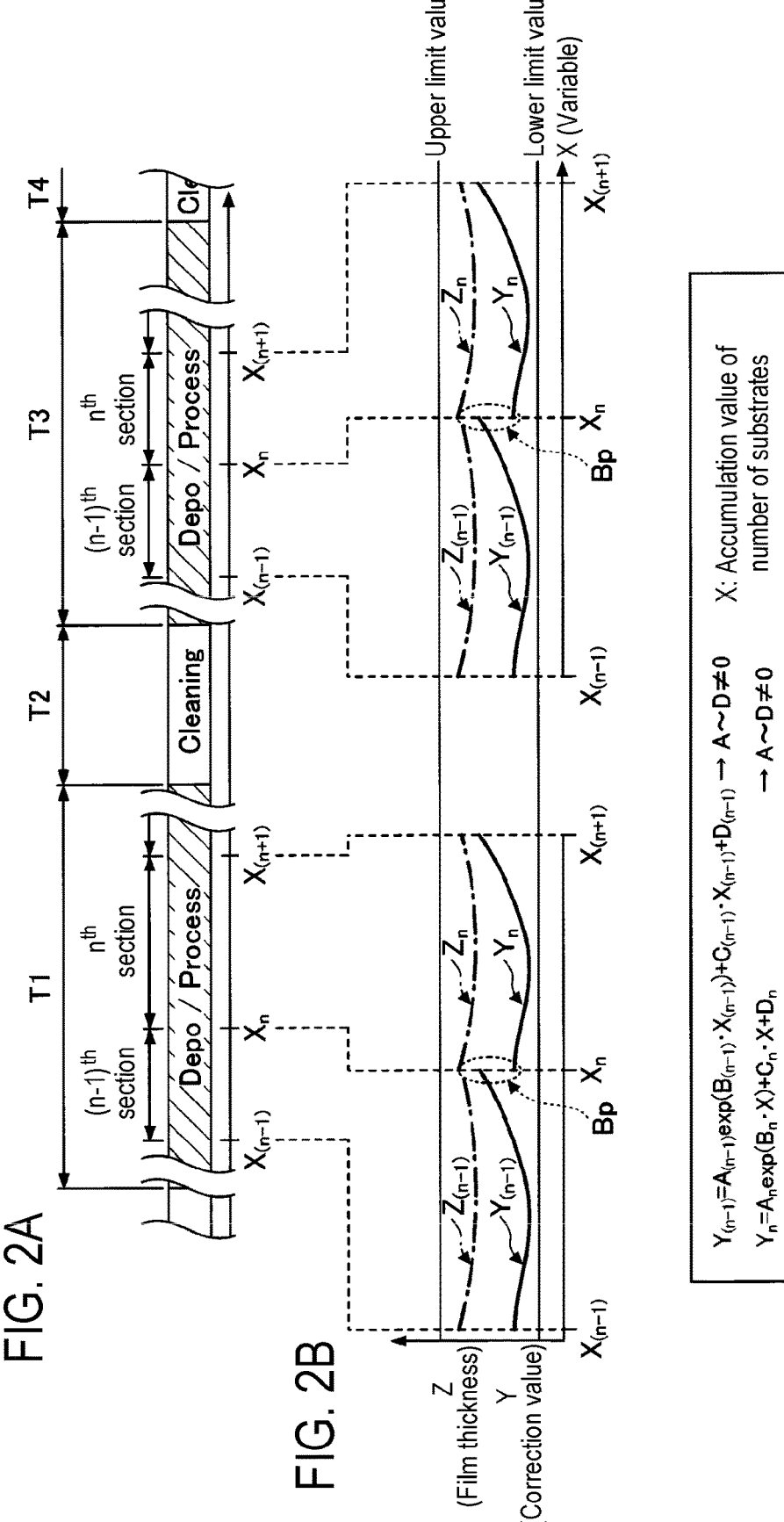
FIGS. 2A and 2B are diagrams illustrating an example of correction of a set power value according to an embodiment.

With reference to FIGS. 2A and 2B, the correction of a set power value for achieving uniformity of the substrates subjected to the continuous film formation processes will be described. FIGS. 2A and 2B are diagrams illustrating an example of correction of a set power value according to an embodiment. Equation (1) used to calculate a correction value Y for a set power value is presented below.

$$Y = A\exp(BX) + CX + D \qquad \text{Equation (1)}$$

A, B, C, and D in Equation (1) are coefficients, and the variable X is an accumulation value of the number of substrates (the number of processed substrates). At least one of the coefficients A, C, and D is not 0, and when the coefficient A is not 0, the coefficient B is also not 0. The accumulation value of the number of substrates is an example of the variable X, and the variable X is not limited to this, and may be any value indicating the processed amount of the substrates having been subjected to the continuous film formation processes. For example, the variable X may be the accumulation value of the number of substrates, the accumulation value of the film thicknesses formed on the substrates, or the application time of power applied in the chamber of the substrate processing apparatus.

Based on the correction value Y obtained by substituting the coefficients A, B, C, and D and the variable X, which is the accumulation value of the number of substrates, into Equation (1), the set power value is corrected. It is possible to control the film thickness by applying the corrected power value to the interior of the chamber and processing the substrates.

FIG. 2A shows the same processing states as FIG. 1A. As shown in FIG. 2A, when several thousand substrates are subjected to the continuous film formation processes in the time T1 and several thousand substrates are subjected to the continuous film formation processes in the time T3, the variable X, which is the accumulation value of the number of substrates, becomes several thousand in the time T1. Similarly, the variable X becomes several thousand in the time T3. However, the number of substrates to be processed continuously is not limited to this.

The variable Z on the vertical axis shown in FIG. 2B is a film thickness on each processed substrate. The steps of the film formation process in the time T1 and the steps of the film formation process in the time T3 are executed based on the same process recipe. In order to suppress the phenomenon shown in FIG. 1B in which as the number of processed substrates indicated by the variable X increases, the film thickness indicated by the variable Z becomes low, the set power value is corrected with the correction value Y. The correction value Y is added to or subtracted from the set power value such that the power value after correction (hereinafter, also referred to as a "corrected power value") becomes a positive value.

By applying the corrected power value and processing the substrates, the variations in film thickness indicated by the variable Z in FIG. 1B are corrected. For example, the film thicknesses indicated by the variables $Z_{(n-1)}$ and $Z_n$ in FIG. 2B fall within the permissible range between the upper limit value and the lower limit value, and uniformity in film thickness of the continuously processed substrates is achieved.

In FIGS. 2A and 2B, with reference to the storage part in which the coefficients A, B, C, and D are grouped and stored for each divided section, the set power value is corrected for each section based on Equation (1), and the coefficients A, B, C, and D for each section, and the correction value Y obtained from the variable X indicating the accumulation value of the number of processed substrates.

For example, in FIGS. 2A and 2B, the steps of the substrate film formation process in the time T1 are divided into a plurality of sections such as a first section, a second section, . . . , an $(n-1)^{th}$ section, an $n^{th}$ section, an $(n+1)^{th}$ section, and so on, and the coefficients A, B, C, and D grouped for each section are set and stored in a memory.

FIGS. 3A and 3B are views illustrating examples of coefficients A, B, C, and D stored in a memory according to an embodiment. As in FIG. 3A, when the continuous film formation processes (deposition processes) to be processed on the substrates are divided into a plurality of sections of a $1^{st}$ section, a $2^{nd}$ section, . . . , an $(n-1)^{th}$ section, an $n^{th}$ section, an $(n+1)^{th}$ section, and so on, the coefficients A, B, C, and D for each section are grouped and stored. For example, the group of the first section and the second section is set to "Group a", and the group of the $(n-1)^{th}$ section, the $n^{th}$ section, and the $(n+1)^{th}$ section is set to "Group b".

FIG. 3B shows values of the coefficients A, B, C, and D set for each group. For example, the coefficients A, B, C, and D of Group a are set to $(A_1, B_1, C_1, D_1)$ and the coefficients A, B, C, and D of Group b are set to $(A_2, B_2, C_2, D_2)$. At least one of the coefficients $A_1, C_1,$ and $D_1$ is not 0, and when the coefficient $A_1$ is not 0, the coefficient $B_1$ is also set to a non-zero value. In addition, at least one of the coefficients $A_2, C_2,$ and $D_2$ is not 0, and when the coefficient $A_2$ is not 0, the coefficient $B_2$ is also set to a non-zero value.

The correction value Y calculated by Equation (1) changes depending on the values of the coefficients A, B, C, and D and the variable X. For example, in Equation (1) presented in the frame of FIGS. 2A and 2B, the coefficients $A_2, B_2, C_2,$ and $D_2$ of the same Group b are used in the $(n-1)^{th}$ section and the $n^{th}$ section. When the coefficients $A_2, B_2, C_2,$ and $D_2$ all have values other than 0, both functions of the exponential term "$A\exp(BX)$" and the linear function term "$CX+D$" are used to calculate the correction value $Y_{(n-1)}$ and the correction value $Y_n$.

When the change in film thickness behaves exponentially, it is possible to improve accuracy by calculating the correction value Y using both the exponential term "A exp (BX)" and the linear function term "CX+D". In the example of FIG. 2B, both functions of the exponential terms "$A_{(n-1)}$ exp(B(n-1)$X_{(n-1)}$)" and "$A_{(n)}$ exp($B_{(n)}X_{(n)}$) and the linear function terms "($C_{(n)}X_{(n-1)}$+D)" and "($C_{(n)}X_{(n)}$+D) are used to calculate the correction value $Y_{(n-1)}$ and the correction value $Y_n$. Therefore, as a result of correcting the set power value with the correction value $Y_{(n-1)}$ and the correction value $Y_n$ and applying the corrected power value to perform the film formation process, it is possible to suppress variations in the thickness variables $Z_{(n-1)}$ and $Z_n$ in the $(n-1)^{th}$ section and the $n^{th}$ section. In FIG. 2B, only the correction value Y and the variable Z in the $(n-1)^{th}$ section and the $n^{th}$ section are presented, while the presentation of the other sections is omitted, it is possible to suppress variations in film thickness by performing similar corrections.

In addition, in FIG. 2B, for the coefficients A, B, C, and D used in the $(n-1)^{th}$ section and the $n^{th}$ section, the same values of the same Group b are used. However, without being limited thereto, for the coefficients A, B, C, and D used in the $(n-1)^{th}$ section and the $n^{th}$ section, different values of different groups may be used. By setting the coefficients by each section, it is possible to more accurately suppress variations in the variable Z of the film thickness. In addition, by changing the coefficients A, B, C, and D for each section, the correction value Y may become discontinuous at the boundaries of the sections, as indicated by the dotted lines "Bp" in the frame.

By grouping the coefficients A, B, C, and D, the coefficients A, B, C, and D separated by each section may be used. In addition, by grouping the coefficients A, B, C, and D, the parameters of the coefficients A, B, C, and D may be easily set. Furthermore, the sections for switching the group of the coefficients A, B, C, and D may be fixed or variable.

In Equation (1), at least one of the coefficients A, C, and D is not zero, and when the coefficient A is not zero, the coefficient B is also not zero. Therefore, the correction value Y is either any of the constant D, the linear function "CX+D", and the exponential function "A exp (BX)", or the value of a combination of two or more of the constant D, the linear function "CX+D", and the exponential function "A exp (BX)".

That is, when the coefficients A, B, and C are 0 and the coefficient D is not 0, the correction value Y is D (constant). When the coefficients A and B are 0 and the coefficients C and D are not 0, the correction value Y=CX+D (linear function including constant). When the coefficients C and D are 0 and the coefficients A and B are not 0, the correction value Y=A exp(BX) (exponential function). When the coefficient C is 0 and the coefficients A, B, and D are not 0, the correction value Y=A exp(BX) (exponential function)+D (constant). When the coefficient D is 0 and the coefficients A, B, and C are not zero, then Y=A exp(BX) (exponential function)+CX (linear function). Thus, the correction value Y is calculated by using at least one of a constant, a linear function, and an exponential function, depending on the coefficients A, B, C, and D used in Equation (1).

Figures 4A, 4B:
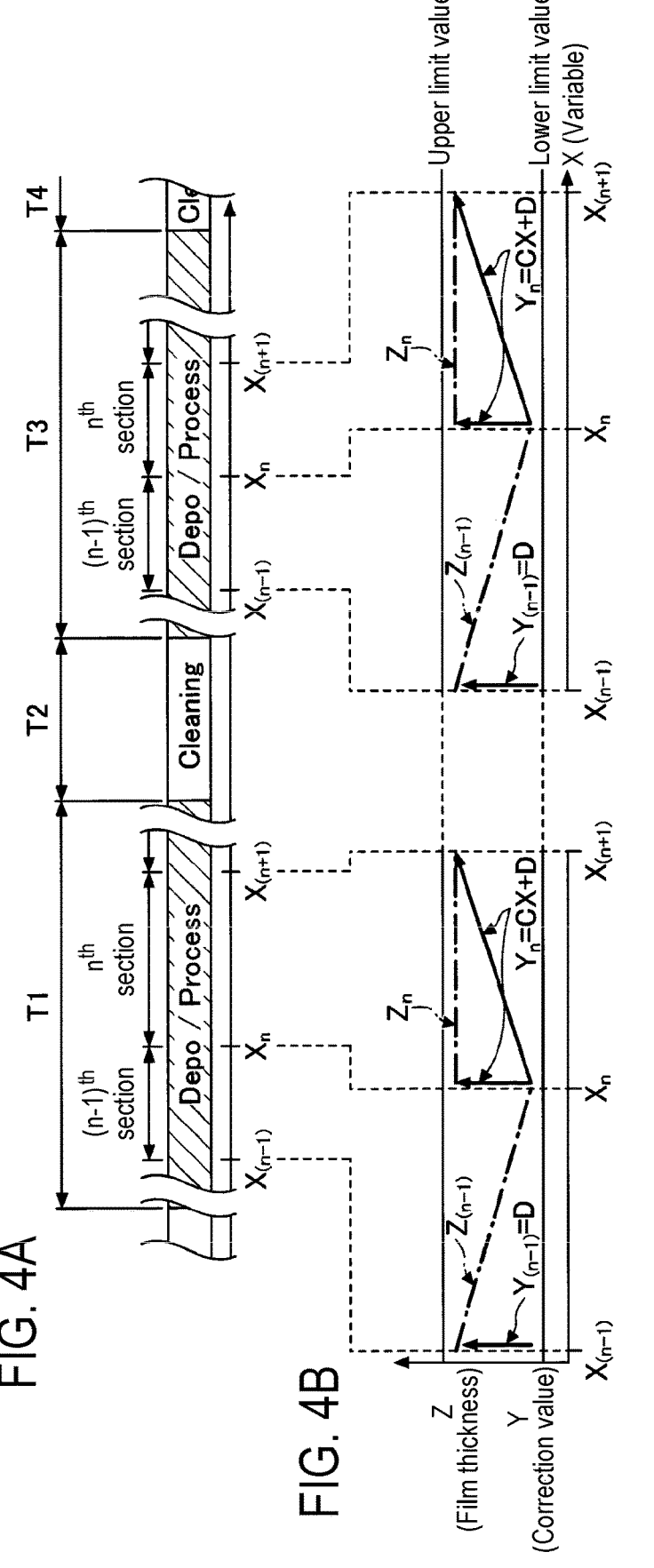
FIGS. 4A and 4B are diagrams illustrating another example of correction of a set power value according to an embodiment.

FIGS. 4A and 4B are diagrams illustrating another example of correction of a set power value according to an embodiment. FIG. 2A shows the same processing states as FIG. 2A. In the example of FIG. 4B, different coefficients A, B, C, and D are used in the $(n-1)^{th}$ section and the $n^{th}$ section, the coefficients A, B, and C are 0 in the $(n-1)^{th}$ section, and the coefficient D is not 0. In this case, the correction value $Y_{(n-1)}$=D (constant). In the $n_{th}$ section, the coefficients A and B are 0 and the coefficients C and D are not 0. In this case, the correction value $Y_n=C_{(n)}X_{(n)}$+D (linear function including a constant). Therefore, in the $(n-1)^{th}$ section, as a result of correcting the set power value with the correction value $Y_{(n-1)}$, the set power value is corrected with the constant D, and the decrease in the film thickness of the variable $Z_{(n-1)}$ is suppressed. In addition, in the $n_{th}$ section, as a result of correcting the set power value with the correction value $Y_n$, the set power value is corrected with the linear function term "$C_{(n)}X_{(n)}$+D", and the decrease in the film thickness of the variable $Z_n$ is suppressed. Since different coefficients A, B, C, and D were used in the $(n-1)^{th}$ section and the $n^{th}$ section, film thickness suppression states are different, as shown in FIG. 4B. In the $(n-1)^{th}$ section, the decrease in the film thickness of the variable Z is suppressed with the correction value Y of the constant D, but the film thickness gradually decreases. In the $n^{th}$ section, the decrease in the film thickness of the variable Z is further suppressed by not only the constant D but also the term "$C_{(n)}X_{(n)}$" included in the correction value Y.

In each section, since the accumulation value of the number of processed substrates differs, the degree of decrease in the film thickness indicated by the variable Z may also differ. In contrast, the coefficients A, B, C, and D of Equation (1) may be optimized to different values in each section. This makes it possible to calculate a proper correction value Y for each section. Therefore, by correcting the set power value according to the degree of decrease in the film thickness indicated by the variable Z for each section and applying the obtained corrected power value, it is possible to suppress the decrease in the film thickness with higher accuracy and to improve uniformity of the film thickness of each substrate in continuous film formation.

The variable X is reset to 0 when the substrate processing in the time T3 is initiated after the cleaning process in the time T2. The time T3 may be divided into the same section as the time T1. In the substrate processing in the time T3, the set power value may be corrected for each section based on the correction value Y obtained from Equation (1), the coefficients A, B, C, and D for each section, and the variable X indicating the accumulation value of the number of substrates by using the same coefficients A, B, C, and D for each section as those of the substrate processing in the time T1. The example of FIG. 4B illustrates an example in which, in the substrate processing time T3, the same coefficients A, B, C, and D are set for the same sections as those of the substrate processing time T1, and the set power value is corrected for each section.

However, the substrate processing in the time T3 may be started after identifying whether there is abnormality in an atmosphere of the chamber using a wafer for use in quality control (QC) in the chamber, after the cleaning process and before initiating the substrate processing in the time T3.

[Substrate Processing Method]

Next, a substrate processing method according to an embodiment will be described with reference to FIG. 5. FIG. 5 is a flowchart illustrating an example of a substrate processing method according to an embodiment. This process is executed by a controller that controls a substrate processing apparatus. The coefficients A, B, C, and D for the first section are obtained in advance from a memory. An initial value of "0" is set to the variable X.

When this process is initiated, the controller prepares a substrate by transporting the substrate into the chamber (step S1). Next, the controller adds 1 to the variable X of the accumulation value of the number of processed substrates (step S2). Next, the controller determines whether there is a change in section (step S3). When determining that there is a change in section, the controller acquires the coefficients A, B, C, and D stored corresponding to the changed section from the memory (step S4). When the controller determines that there is no change in section, the process proceeds to step S5.

Next, the controller substitutes the coefficients A, B, C, and D and the variable X of the accumulation value of the number of processed substrates into Equation (1) to calculate a correction value Y (step S5). When there is a change in section, the coefficients A, B, C, and D are changed, and when there is no change in section, the coefficients A, B, C, and D are not changed.

Next, the controller determines whether the calculated correction value Y is greater than a given upper limit value (step S6). When determining that the correction value Y is greater than the upper limit value, the controller performs error processing (step S8), and terminates the present process. When determining in step S6 that the correction value Y is equal to or less than the upper limit value, the controller determines whether the correction value Y is smaller than a given lower limit value (step S7). When determining that the correction value Y is smaller than the lower limit value, the controller performs error processing (step S8), and terminates the present process. In step S7, when determining that the correction value Y is equal to or greater than the lower limit value, the controller corrects the set power value with the correction value Y, and calculates a corrected power value (step S9). Specifically, the correction value Y is added to or subtracted from the set power value so that the corrected power value becomes a positive value.

Next, the controller supplies a processing gas for processing the substrate into the chamber (step S10). Next, the controller supplies power of the corrected power value into the chamber (step S11). Next, the controller performs a film formation process on the substrate (step S12), and terminates the present process.

According to this, the substrate processing method according to the present embodiment includes the following steps (a) to (c).

(a) a step of preparing a substrate in a chamber of a substrate processing apparatus (b) a step of correcting, with reference to a storage part in which coefficients A, B, C, and D of Equation (1) used to calculate a correction value Y for a set power value are stored, the power value based on the correction value Y obtained from Equation (1) above, the coefficients A, B, C, and D, and a variable X, which indicates a processed amount of substrates (c) a step of processing the prepared substrate by applying power at the corrected power value into the chamber Equation (1) used in step (b) is expressed as Y=A exp (BX)+CX+D. In Equation (1), at least one of the coefficients A, C, and D is not zero, and when the coefficient A is not zero, the coefficient B is also not zero.

This makes it possible to suppress variations in substrate processing by setting the coefficients A, B, C, and D to given values that satisfy the above conditions. When the calculated correction value Y is larger than the given upper limit value or smaller than the given lower limit value, the set power value is not corrected based on the correction value Y, and the processing of the substrate is stopped. This makes it possible to avoid execution of non-uniform substrate processing which may be caused by correcting the set power value with a non-permissible correction value Y. The error processing in step S8 may be performed by a method of indicating that the substrate processing is stopped to notify an operator thereof, a method of indicating whether the correction value Y exceeds the upper limit value or the lower limit value to notify an operator thereof, or another method.

The substrate processing method according to the present embodiment may include a step of calculating the coefficients A, B, C, and D used in Equation (1) in advance and storing the coefficients in the memory before the above steps (a) to (c). In this step, the coefficients A, B, C, and D may be calculated in advance for each section and stored in the memory, or the coefficients A, B, C, and D may be calculated and stored in the memory without being divided into sections.

[Substrate Processing Apparatus]

Figure 6:
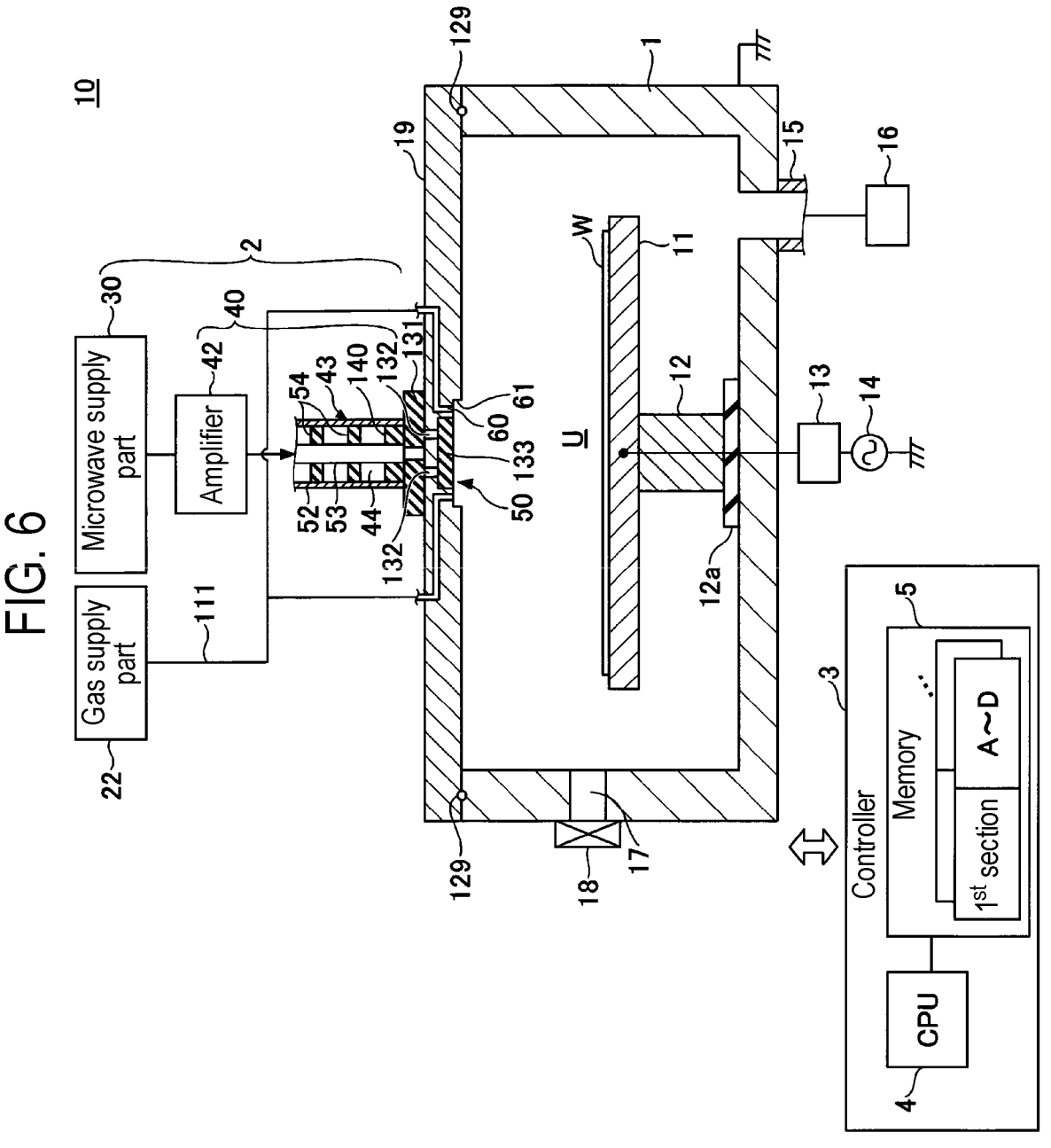
FIG. 6 is a view illustrating an example of a substrate processing apparatus according to an embodiment.

The substrate processing method described above is executed by the controller of the substrate processing apparatus, and the substrate processing apparatus applies power of a corrected power value. A substrate processing apparatus according to an embodiment will be described with reference to FIG. 6. FIG. 6 is a view illustrating an example of a substrate processing apparatus according to an embodiment. In the substrate processing apparatus illustrated in FIGS. 6 and 7, which will be described later, microwave power is used as the power applied to the chamber. In this case, the substrate processing method corrects the set power value of microwaves. However, the present disclosure is not limited thereto, and when the substrate processing apparatus applies radio-frequency power, the substrate processing method corrects the radio-frequency set power value. The substrate processing method according to the present embodiment may be executed by the controller 3 illustrated in FIG. 6.

A substrate processing apparatus 10 includes a chamber 1 that accommodates a substrate W, an example of which is a wafer. The substrate processing apparatus 10 performs a predetermined process on the substrate W by surface wave plasma formed on the ceiling surface of the chamber 1 by microwaves. The predetermined process is a film formation process, an etching process, an ashing process, or the like.

The substrate processing apparatus 10 includes a chamber 1, a power supply 2, a controller 3, and a gas supply part 22. The chamber 1 is a substantially cylindrical container made of a metal material such as aluminum or stainless steel, and is grounded.

The chamber 1 and a disk-shaped ceiling plate 19 form a processing space U inside the chamber 1. A support ring 129 is provided on the contact surface between the chamber 1 and the ceiling plate 19 to hermetically seal the interior of the chamber 1.

The power supply 2 includes a microwave supply part 30, a microwave transmission part 40, and a microwave radiation part 50. The microwaves output from the microwave supply part 30 are introduced into the chamber 1 via the microwave transmission part 40 and the microwave radiation part 50. The gas output from the gas supply part 22 is supplied into the chamber 1 from the gas supply hole 60 via the gas line 111. The gas is excited by the electric field of the introduced microwaves, thereby forming surface wave plasma.

A stage 11 on which a substrate W is placed is provided in the chamber 1. The substrate W is carried in by a transport arm and prepared on the stage 11. The stage 11 is supported by a cylindrical support member 12 provided on the bottom of the chamber 1 via an insulating member 12a. The stage 11 may be provided with an electrostatic chuck for electrostatically attracting a substrate W, a temperature control mechanism, a gas flow path for supplying a heat transfer gas to the rear surface of the substrate W, and the like.

A radio-frequency bias power supply 14 is connected to the stage 11 via a matcher 13. By supplying radio-frequency power to the stage 11 from the radio-frequency bias power supply 14, the ions in plasma are drawn into the substrate W side. The radio-frequency bias power supply 14 may not be provided depending on a plasma processing characteristic.

An exhaust pipe 15 is connected to the bottom portion of the chamber 1, and an exhaust device 16 including a vacuum pump is connected to the exhaust pipe 15. When the exhaust device 16 is operated, the interior of the chamber 1 is evacuated, whereby the interior of the chamber 1 is quickly depressurized to a predetermined degree of vacuum. The side surface of the chamber 1 is provided with a carry-in/out port 17 for performing carry-in/out of a substrate W and a gate valve 18 for opening/closing the carry-in/out port 17.

The microwave transmission part 40 includes an amplifier 42 and a microwave introduction part 43. The microwave transmission part 40 has a function of introducing microwaves into the microwave radiation part 50 and a function of impedance matching.

The amplifier 42 amplifies microwaves. In the microwave introduction part 43, a cylindrical outer conductor 52 and a rod-shaped inner conductor 53 provided at the center thereof are coaxially arranged. The space between the outer conductor 52 and the inner conductor 53 forms a microwave transmission path 44, through which microwaves propagate toward the microwave radiation part 50.

The microwave introduction part 43 is provided with slugs 54 and an impedance adjustment member 140 located at the tip thereof. By moving the slugs 54, the impedance of a load (plasma) in the chamber 1 is matched with the characteristic impedance of a microwave power supply in the microwave supply part 30. The impedance adjustment member 140 is made of a dielectric material, and is configured to adjust the impedance of the microwave transmission path 44 based on the relative dielectric constant thereof.

The microwave radiation part 50 includes a dielectric plate 131, a slot 132, and a dielectric window 133. The dielectric plate 131 is formed of a disk-shaped dielectric material that transmits microwaves, and is arranged on the top surface of the ceiling plate 19.

The dielectric window 133 is provided below the dielectric plate 131 via the slot 132 formed in the ceiling plate 19. The dielectric window 133 is disposed in the ceiling plate 19. The microwave radiation part 50 is exposed in a recess 61 formed on the rear surface of the ceiling plate 19 and radiates microwaves to the plasma generation space U.

Each part of the substrate processing apparatus 10 is controlled by the controller 3. The controller 3 includes a CPU 4 and a memory 5. A process recipe and information on the coefficients A, B, C, and D are stored in the memory 5. The CPU 4 controls processing of the substrate W based on the process recipe. The controller 3 includes a display and a touch panel so as to enable an error indication and data inputting.

Figure 7:
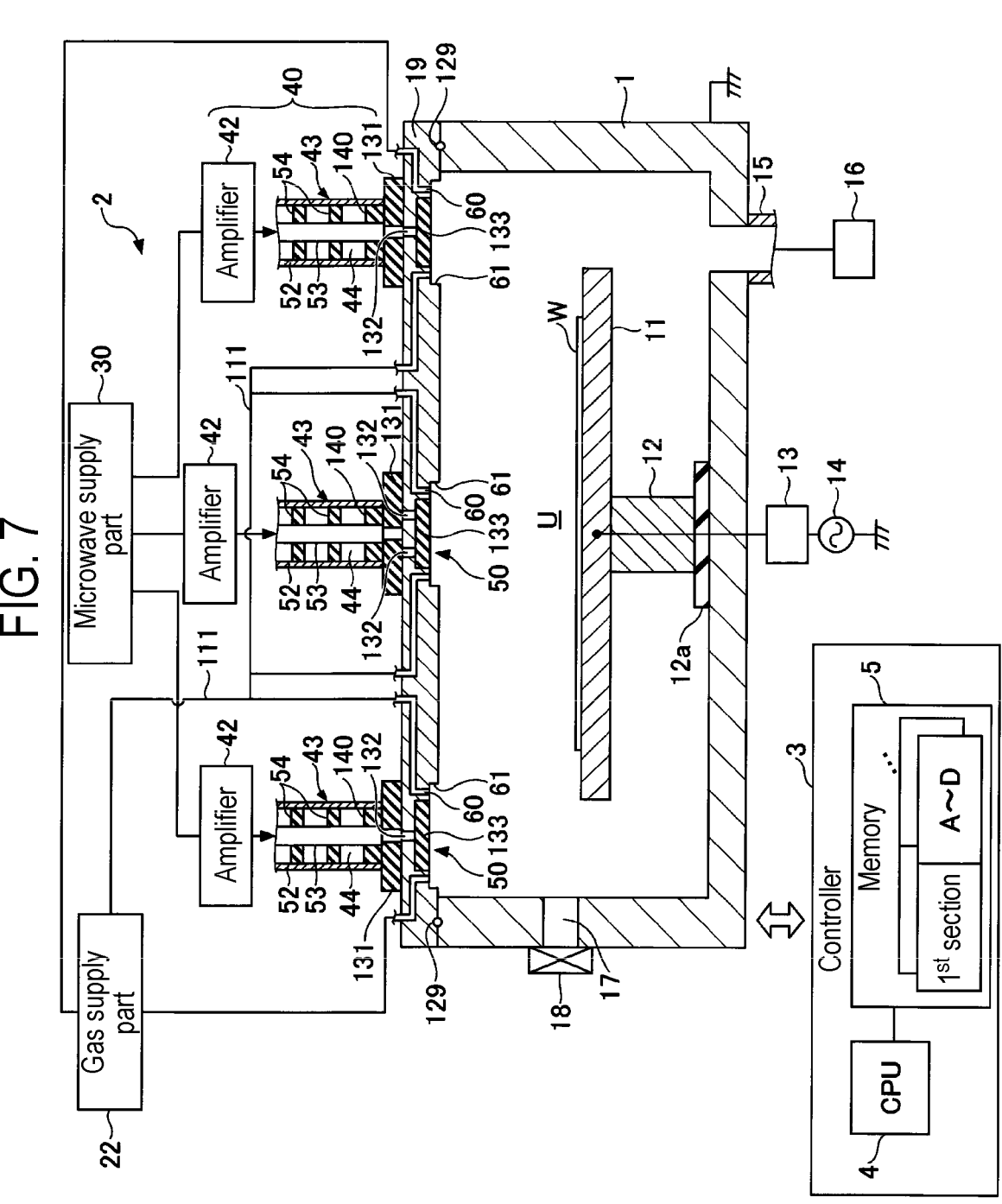
FIG. 7 is a view illustrating another example of a substrate processing apparatus according to an embodiment.

FIG. 7 is a view illustrating another example of the substrate processing apparatus 10 according to an embodiment. The substrate processing apparatus 10 of FIG. 7 is different from the substrate processing apparatus 10 of FIG. 6 in that the substrate processing apparatus 10 of FIG. 7 is provided with a plurality of microwave transmission parts 40.

One microwave transmission part 40 is disposed in the center of the ceiling plate 19, and a plurality of microwave transmission parts 40 are arranged around the one microwave transmission part 40 at regular intervals in the circumferential direction. The number of microwave transmission parts 40 arranged in the circumferential direction is preferably three or more, and may be, for example, three to six.

When the substrate processing apparatus 10 of FIG. 6 executes the substrate processing method according to the present embodiment, microwaves having a corrected power value corrected with the correction value Y are radiated from the microwave radiation part 50. In the substrate processing apparatus 10 of FIG. 7, the microwaves of the corrected power value are radiated from the central microwave radiation part 50 and the surrounding microwave radiation parts 50. In the substrate processing apparatus 10 of FIG. 7, the microwaves radiated from the central microwave radiation part 50 and the microwaves radiated from the surrounding microwave radiation part 50 may be controlled to have the same power value, or may be controlled to have different electric power values at a predetermined ratio. For example, the microwaves radiated from the central microwave radiation part 50 may be controlled to have a corrected power value, and the microwaves radiated from the surrounding microwave radiation parts 50 may be controlled to have a power value obtained by multiplying the corrected power value by a predetermined ratio. However, the above-described power correction is an example, and the power value of the microwaves radiated from each microwave radiation part 50 may be controlled by another method.

As described above, with the substrate processing method and the substrate processing apparatus of the present embodiment, it is possible to suppress variations in substrate processing.

The substrate processing method and the substrate processing apparatus according to the embodiments disclosed herein should be considered as being exemplary in all respects and not restrictive. The above-described embodiments may be modified and improved in various forms without departing from the scope and spirit of the appended claims. The matters described in the plurality of embodiments may take other configurations within a non-contradictory range, and may be combined within a non-contradictory range.

The substrate processing apparatus of the present disclosure may be applied not only to correction of microwave power, but also to correction of radio-frequency power. That is, the substrate processing apparatus of the present disclosure is applicable to any type of apparatus of a radial line slot antenna (RLSA) apparatus, an electron cyclotron resonance plasma (ECR) apparatus, a helicon wave plasma (HWP) apparatus, a capacitively coupled plasma (CCP) apparatus, an inductively coupled plasma (ICP) apparatus, and an atomic layer deposition (ALD) apparatus.

The present international application claims priority based on Japanese Patent Application No. 2020-054588 filed on Mar. 25, 2020, the disclosure of which is incorporated herein in its entirety by reference.

EXPLANATION OF REFERENCE NUMERALS

1: chamber, 2: power supply, 3: controller, 10: substrate processing apparatus, 11: stage, 14: radio-frequency bias supply, 19: ceiling plate, 22: gas supply part, 30: microwave supply part, 40: microwave transmission part, 43: microwave introduction part, 44: microwave transmission line, 50: microwave radiation part, 52: outer conductor, 53: inner conductor, 54: slug, 60: gas supply hole, 132: slot, 133: dielectric window, W: substrate

What is claimed is:

1. A substrate processing method comprising:

preparing a substrate in a chamber of a substrate processing apparatus;

correcting a set power value of electric power applied to the chamber based on a correction value Y obtained from Equation (1), coefficients A, B, C, and D, and a variable X indicating a processed amount of a plurality of substrates having been subjected to continuous film formation processes, while referring to a storage part in which the coefficients A, B, C, and D of the Equation (1) used to calculate the correction value Y for the set power value are stored; and processing the prepared substrate by applying power with the corrected power value into the chamber, wherein the Equation (1) is indicated as follows:

$$Y = A \exp(BX) + CX + D \qquad \text{Equation (1)}$$

wherein at least one of the coefficients A, C, and D is not zero, and when the coefficient A is not zero, the coefficient B is also not zero, and wherein when the correction value Y is greater than a given upper limit value, or when the correction value Y is less than a given lower limit value, the processing the prepared substrate is not performed.

2. The substrate processing method of claim 1, further comprising:

calculating the coefficients A, B, C, and D used in the Equation (1) and storing the calculated coefficients in the storage part.

3. The substrate processing method of claim 2, wherein the variable X is either an accumulation value of a number of substrates, an accumulation value of film thicknesses formed on the substrates, or an application time of the power applied into the chamber.

4. The substrate processing method of claim 3, wherein, in the correcting the set power value, the processing the prepared substrate is divided into a plurality of sections, and with reference to the storage part in which the coefficients A, B, C, and D are grouped and stored for each divided section, the set power value is corrected for each section based on the correction value Y obtained from the Equation (1), the coefficients A, B, C, and D, and the variable X.

5. The substrate processing method of claim 4, wherein, in the correcting the set power value, when substrate processing is initiated after a cleaning process in the chamber, the variable X is set to an initial value, the processing the prepared substrate is divided into the same sections as the processing the prepared substrate before the cleaning process, and by using the coefficients A, B, C, and D grouped for each divided section, the set power value is corrected for each section based on the correction value Y obtained from the Equation (1), the coefficients A, B, C, and D for each section, and the variable X.

6. The substrate processing method of claim 1, wherein the variable X is either an accumulation value of a number of substrates, an accumulation value of film thicknesses formed on the substrates, or an application time of the power applied into the chamber.

7. The substrate processing method of claim 1, wherein, in the correcting the set power value, the processing the prepared substrate is divided into a plurality of sections, and with reference to the storage part in which the coefficients A, B, C, and D are grouped and stored for each divided section, the set power value is corrected for each section based on the correction value Y obtained from the Equation (1), the coefficients A, B, C, and D, and the variable X.

* * * * *